(12) United States Patent
Miller et al.

(10) Patent No.: US 7,316,894 B2
(45) Date of Patent: Jan. 8, 2008

(54) DEVELOPER REGENERATORS

(75) Inventors: Gary Roger Miller, Fort Collins, CO (US); Kevin Wieland, Greeley, CO (US); Melanie Kelim, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/388,850

(22) Filed: Mar. 24, 2006

(65) Prior Publication Data

US 2006/0166146 A1  Jul. 27, 2006

Related U.S. Application Data

(62) Division of application No. 10/681,574, filed on Oct. 8, 2003.

(51) Int. Cl.
 *G03F 7/30* (2006.01)
(52) U.S. Cl. .................. 430/399; 430/300; 430/302
(58) Field of Classification Search ............... 430/399, 430/300, 302
 See application file for complete search history.

(56) References Cited

U.S. PATENT DOCUMENTS

| | | | |
|---|---|---|---|
| 4,025,344 A | 5/1977 | Allen et al. | |
| RE30,123 E | 10/1979 | Crowell et al. | |
| 4,577,948 A | 3/1986 | Lawson et al. | |
| 4,786,584 A | 11/1988 | Endo | |
| 5,223,881 A | 6/1993 | Nakagawa et al. | |
| 5,316,892 A | 5/1994 | Walls et al. | |
| 5,416,552 A | 5/1995 | Fakler | |
| 5,466,559 A | 11/1995 | Miller et al. | |
| 5,479,233 A | 12/1995 | Svensson | |
| 5,480,762 A | 1/1996 | Toyama et al. | |
| 5,582,952 A | 12/1996 | Kawamura et al. | |
| 5,617,178 A * | 4/1997 | Goggins | 355/22 |
| 5,701,542 A | 12/1997 | Sasayama | |
| 5,734,944 A | 3/1998 | Seeley et al. | |
| 5,811,224 A | 9/1998 | Seeley et al. | |
| 5,837,425 A | 11/1998 | Nakanishi et al. | |
| 5,914,217 A | 6/1999 | Miller et al. | |
| 5,972,572 A | 10/1999 | Konrad et al. | |
| 6,100,016 A | 8/2000 | Denzinger et al. | |
| 6,143,479 A | 11/2000 | Fiebag et al. | |
| 6,255,042 B1 | 7/2001 | Fiebag et al. | |
| 6,294,311 B1 | 9/2001 | Shimazu et al. | |
| 6,309,792 B1 | 10/2001 | Hauck et al. | |
| 6,352,811 B1 | 3/2002 | Patel et al. | |
| 6,352,812 B1 | 3/2002 | Shimazu et al. | |
| 6,364,544 B1 | 4/2002 | Sasayama et al. | |

(Continued)

FOREIGN PATENT DOCUMENTS

EP   0 405 986   1/1991

(Continued)

*Primary Examiner*—Hoa Van Le
(74) *Attorney, Agent, or Firm*—J. Lanny Tucker

(57) ABSTRACT

The present invention provides an aqueous regenerator for addition to an aqueous developer that contains an organic solvent, a dispersing agent and a weak base, and has a pH of between about 8 and less than about 13. The aqueous regenerator includes an organic solvent, dispersing agent, and an effective amount of a strong base such that the regenerator has a greater pH than the developer into which the regenerator is to be added.

18 Claims, 1 Drawing Sheet

U.S. PATENT DOCUMENTS

| | | |
|---|---|---|
| 6,391,530 B1 | 5/2002 | Timpe et al. |
| 6,528,228 B2 | 3/2003 | Hauck et al. |
| 6,541,188 B2 | 4/2003 | Fiebag et al. |
| 6,555,291 B1 | 4/2003 | Hauck |
| 6,562,555 B2 | 5/2003 | Fiebag et al. |
| 6,740,468 B2 | 5/2004 | Aoshima |
| 2002/0048722 A1* | 4/2002 | Aoshima ................ 430/270.1 |
| 2002/0092436 A1 | 7/2002 | Tsuchiya et al. |
| 2002/0182539 A1* | 12/2002 | Fujimaki et al. ......... 430/281.1 |
| 2003/0036024 A1 | 2/2003 | Fiebag et al. |
| 2003/0049564 A1 | 3/2003 | Higashi et al. |
| 2003/0113667 A1 | 6/2003 | Matsumura |
| 2003/0129526 A1 | 7/2003 | Haley et al. |
| 2003/0138732 A1 | 7/2003 | Nagase |

FOREIGN PATENT DOCUMENTS

| | | |
|---|---|---|
| EP | 0 426 470 | 5/1991 |
| EP | 0 602 736 | 6/1994 |
| EP | 0 990 950 | 4/2000 |
| EP | 1 091 253 | 4/2001 |
| EP | 1 180 728 | 2/2002 |
| EP | 1 204 003 | 5/2002 |
| EP | 1 235 106 | 8/2002 |
| EP | 1 246 009 | 8/2002 |
| EP | 1 260 867 | 11/2002 |
| EP | 1 334 824 | 8/2003 |
| WO | WO 02/33491 | 4/2002 |
| WO | WO 03/042762 | 5/2003 |

* cited by examiner

DEVELOPER REGENERATORS

CROSS-REFERENCE TO RELATED APPLICATION

This is a Divisional of application Ser. No. 10/681,574, filed Oct. 8, 2003, now allowed.

BACKGROUND

The art of lithographic printing is based on the immiscibility of ink and water. A lithographic printing plate is composed of ink receptive regions, commonly referred to as the "image area," and hydrophilic regions. When the surface of the printing plate is moistened with water and printing ink is applied, the hydrophilic regions retain the water and repel the printing ink, and the image area retains the printing ink and repels the water. The printing ink retained on the image area may then be transferred to the surface of a material upon which the image is to be reproduced. Typically, the ink is first transferred to an intermediate blanket, which in turn transfers the ink to the desired surface.

Lithographic printing plates precursors typically include a radiation-sensitive coating applied over the hydrophilic surface of a substrate. Conventional radiation-sensitive coatings include photosensitive components dispersed within an organic polymeric binder. After a portion of the coating is exposed to radiation (commonly referred to as imagewise exposure), the exposed portion becomes either more developable or less developable in a particular liquid than an unexposed portion of the coating. A printing plate precursor is generally considered a positive-working plate if, after exposure to radiation, the exposed portions or areas of the radiation-sensitive coating become more developable and are removed in the developing process to reveal the hydrophilic surface. Conversely, the precursor is considered a negative-working plate if the exposed portions or areas become less developable in the developer and the unexposed portions or areas are removed in the developing process.

After imaging, the precursors are contacted with a developer to remove either the exposed or unexposed portions of the radiation-sensitive coating to form a printing plate. This process is generally performed using a developer system, which is capable of receiving imaged printing plate precursors, and then contacting the precursors with a developer either by spraying the developer onto the precursor or by immersing the precursor in a developer bath. During development, portions of the radiation-sensitive composition are removed from the precursor to reveal the substrate surface, and portions remain on the plate to provide an ink-receptive image. After the developing step, the printing plates are then washed to remove excess developer.

Suitable developers for processing printing plate precursors may fall within at least three general categories defined by the developer's pH range and whether the developer includes an organic solvent and/or dispersing agent. Each category is effective in developing particular types of radiation-sensitive compositions. A first category of developers includes highly alkaline aqueous developers, generally having a pH of greater than about 13. These developers utilize the presence of hydroxyl ions to develop the imaged printing plate precursors. However, these highly alkaline developers do not normally include organic solvents (e.g. organic alcohols) because the combined activities of the hydroxyl ions and organic solvent may degrade the image area on a printing plate precursor. Examples of developers falling within this category include ProTherm brand developers and MX 1813 brand developers, both available from Kodak Polychrome Graphics, Norwalk, Conn.

A second category of developers includes acidic to substantially neutral developers, generally having a pH between about 2 and less than 8. Developers falling within this second category contain organic solvents, acids and/or weak bases to control pH activity, and dispersing agents (e.g. organic sulfates or sulfonates) to suspend, disperse or dissolve printing plate coating materials removed during the development process. These types of developers do not include strong bases. An example of a developer falling within this category is the Aqua-Image brand developer available from Kodak Polychrome Graphics.

A third category includes developers that have pH ranges between about 8 and less than about 13, more particularly between about 8 and about 12. These developers may contain organic solvents, dispersing agents and at least one weak base (e.g., an organic amine such as ethanolamine, diethanolamine or triethanolamine). An example of a developer falling within this category includes 956 brand developer available from Kodak Polychrome Graphics.

During the development of printing plate precursors, the activity of a volume of developer (i.e. the ability of the developer to remove desired portions of the radiation-sensitive coating to produce an image) may vary due to the depletion of, or changes in, various components of the developer. For example, over time, the concentration of the organic solvent or the dispersing agent, as well as the pH of the developer may vary. Changes in developer activity may be caused by loss of developer components as printing plates carry developer out of the developer system after development. Additionally, interactions with the radiation-sensitive coatings of the printing plate precursors may also affect developer activity. In particular, the pH of the developer may change due to acid/base interactions with imaged portions of radiation-sensitive coatings. This loss of developer activity may result in inconsistency in overall dot density over a cycle of developed printing plates, which may have adverse effects during printing.

Thus, in certain circumstances, developer activity is been restored, maintained or increased (collectively referred to herein as "maintained") through the addition of replenishers or regenerators to the volume of developer. As used herein, the term "replenisher" refers to a substance having approximately the same activity as the developer. Thus, the developer itself is often used as a replenisher to maintain the volume of developer contained in the developer apparatus. As used herein, the term "regenerator" refers to a substance having a different level of activity than the developer to which it is added. For example, the regenerator may have a different pH than the developer.

Examples of first category (i.e. highly alkaline) developer regenerators include 9008 brand regenerator and MX 1919 brand regenerator, both available from Kodak Polychrome Graphics. These regenerators include the same active components as the developer, but have a higher pH in order to maintain developer activity. An example of a second category (acidic to neutral) developer regenerator includes Aqua-Image Top-Off brand regenerator, also available from Kodak Polychrome Graphics. This regenerator includes a higher concentration of organic solvent and dispersing agent than the developer to maintain activity.

Traditionally, the third category of developers (i.e. containing a weak base and having a pH between about 8 and less than about 13) did not require the use of a regenerator because precise control of developer activity was not thought necessary to develop a standard cycle of printing plate precursors with consistent dot densities. However, recent advances in imaging technology, as well as a desire to utilize longer development cycles, have necessitated an increasing level of precision and consistency in dot density for plates developed by third category developers. For example, the advent of laser imaging systems has provided for more precise imaging than conventional imaging methods. This enhanced imaging precision, in turn, has led to an increase in the use of stochastic (FM) screening methods in the printing industry. Stochastic screening varies spacing between dots (and optionally dot size) to create the illusion of continuous tones. In contrast, conventional screening (AM) methods rely on changes in dot size to produce the illusion of continuous tones. First order stochastic screening produces dots having the same size, but varies spacing between the dots. Second order screening produces dots with both size and spacing variation. Hybrid screening uses a combination of conventional and stochastic screening.

Stochastic screening requires precisely controlled dot size, density and spacing in order to create the appearance of continuous tones. However, the activity of third category developers changes sufficiently during the development of a cycle of printing plate precursors to adversely affect dot density consistency, particularly over extended development cycles.

SUMMARY OF THE INVENTION

In one embodiment, the present invention provides an aqueous regenerator for addition to an aqueous developer that includes an organic solvent, a dispersing agent and a weak base, and has a pH of between about 8 and less than about 13. The aqueous regenerator includes an organic solvent and a dispersing agent, as well as an effective amount of at least one strong base such that the regenerator has a pH greater than the pH of the developer. In one embodiment, the aqueous regenerator may have a pH of about 12 or greater. The regenerator may also have a greater conductivity than the developer.

A wide range of organic solvents may be used in the aqueous regenerators of the present invention. As used herein, the phrase "organic solvent" refers to an organic substance capable of at least partially dissolving, dispersing or swelling a radiation sensitive material placed in contact with a developer containing the organic solvent. Suitable organic solvents include may include an alcohol moiety, for example benzyl alcohol, phenoxyethanol, phenoxypropanol and combinations thereof. The organic solvent may also include esters of ethylene glycol or propylene glycol with acids containing alkyl groups of $C_{1-6}$, or ethers of ethylene glycol, diethylene glycol or propylene glycol containing alkyl groups of $C_{1-6}$. The concentration of the organic solvent may range from between about 1 and about 12 weight percent, more particularly between about 3 and about 6 weight percent. Combinations of suitable solvents may also be utilized in embodiments of the present invention.

The regenerator may also include one or more dispersing agents. The total concentration of the dispersing agent may be in the range of between about 4 and about 20 weight percent, more particularly, between about 7 and about 15 weight percent. Suitable dispersing agents may include cationic, anionic, nonionic or amphoteric surfactants. Particularly suitable dispersing agents may include a sulfate or sulfonate moiety, for example, alkali metal alkyl sulfates, alkali metal alkylnaphthalenesulfonates, and alkali metal alkylbenzene sulfonates. Examples of particularly suitable surfactants include sodium octyl sulfate, sodium methylnaphthalenesulfonate, sodium xylene sulfonate, and sodium toluene sulfonate. The surfactants may be added to the regenerator as an aqueous solution.

Suitable strong bases for use in the aqueous regenerator may have a $K_b$ of about 1 or greater. The concentration of the strong base may range from between about 0.1 and about 5.0 weight percent. Examples of suitable strong bases include hydroxides, more specifically metal hydroxides such as sodium, potassium and lithium hydroxide, as well as combinations thereof.

Optionally, the aqueous regenerator may include a weak base. Suitable weak bases may have a $K_b$ of between about $1 \times 10^{-2}$ and about $1 \times 10^{-5}$. The concentration of the weak base may range from between about 0.1 to about 5 weight percent. Examples of suitable weak bases include amines, for example, monoethanolamine, diethanolamine, triethanolamine, or salts, such as sodium carbonate, potassium carbonate, sodium bicarbonate, potassium bicarbonate, trisodium phosphate, tripotassium phosphate or combinations or derivatives thereof.

In yet another embodiment, the present invention provides a developer system for preparing printing plates. The system includes a developer unit containing an aqueous developer. The aqueous developer includes an organic solvent, a weak base and a dispersing agent and has a pH between about 8 and less than about 13. The developer unit is adapted to contact printing plate precursors with the developer to form an image on the printing plate. The system further includes a regenerator unit containing an aqueous regenerator for addition to the first vessel. The regenerator includes an organic solvent and a dispersing agent, as well as an effective amount of at least one strong base such that the regenerator has a greater pH than the developer. The regenerator unit also is adapted to controllably deliver an effective amount of the aqueous regenerator to the developer unit to maintain the activity of the aqueous developer. For example, the aqueous regenerator may maintain the organic solvent concentration, dispersing agent concentration, pH and/or conductivity of the developer. One or more sensors may be utilized to monitor the activity of the developer.

In a further embodiment, the present invention provides a method for treating an aqueous developer after developing a portion of at least one printing plate precursor. The developer includes an organic solvent, a dispersing agent and a weak base, and has a pH between about 8 and less than about 13. The method includes the step of adding an effective amount of an aqueous regenerator to the developer to maintain the activity of the developer. The regenerator includes an organic solvent and a dispersing agent, and an effective amount of at least one strong base such that the regenerator has a greater (more basic) pH than the developer.

The pH of the developer may be maintained at between about 8 and less than about 13, more particularly between about 9 and about 11, even more particularly, between about 9.5 and about 10.5. The organic solvent concentration of the developer may be maintained at between about 2 and about 8 weight percent, more particularly between about 3 and about 6 weight percent. The dispersing agent concentration and/or conductivity of the developer may also be maintained.

In yet another embodiment, the present invention provides a method for developing a plurality of imaged printing plate precursors. A portion of at least one imaged printing plate precursor is contacted with an aqueous developer including an organic solvent, a dispersing agent and a weak base and having a pH between about 8 and less than about 13. An effective amount of an aqueous regenerator is then added to the developer to maintain the activity of the developer. The regenerator includes an organic solvent and a dispersing agent, as well as an effective amount of at least one strong base such that the pH of the regenerator is greater than the pH of the developer. After adding the regenerator, a portion of one or more additional printing plate precursors may then be developed.

This method may be used to develop printing plate precursors having a variety of radiation-sensitive compositions, particularly radiation-sensitive compositions that tend to change the pH of the developer. Suitable radiation-sensitive compositions may be laser imageable, and may also include a polymeric material. Suitable polymeric materials may include acidic or weakly basic functionality such as a carboxylic acid moiety. Specific examples of suitable polymeric materials include acrylic acid polymers, methacrylic acid polymers or combinations, derivatives or copolymers thereof. Other suitable polymeric materials include phenolic resins. In a particular embodiment, the radiation-sensitive composition may be applied in multiple layers onto a substrate. For example, a first layer that is soluble in the aqueous developer may be applied onto the substrate. A second layer that is not soluble (but is dispersible) in the developer may then be applied onto the first layer.

In yet a further embodiment, the present invention provides a method of forming a plurality of printing plates. A plurality of printing plate precursors, each including a radiation-sensitive composition applied onto a substrate are imagewise exposed to radiation to form a plurality of imaged printing plate precursors. A portion of at least one of the imaged printing plate precursors is then contacted with an aqueous developer to form a printing plate. The developer includes an organic solvent, a dispersing agent, and a weak base, and has a pH between about 8 and less than about 13. An effective amount of an aqueous regenerator to maintain the activity of the developer is then added to the developer. The regenerator includes an organic solvent and a dispersing agent, and an effective amount of at least one strong base such that the pH of the regenerator is greater than the pH of the developer. After adding the regenerator, at least one additional imaged printing plate precursor is contacted with the developer to form a printing plate. In one embodiment, the imagewise exposure step includes the use of stochastic screening methods and systems.

DETAILED DESCRIPTION

Figure 1:
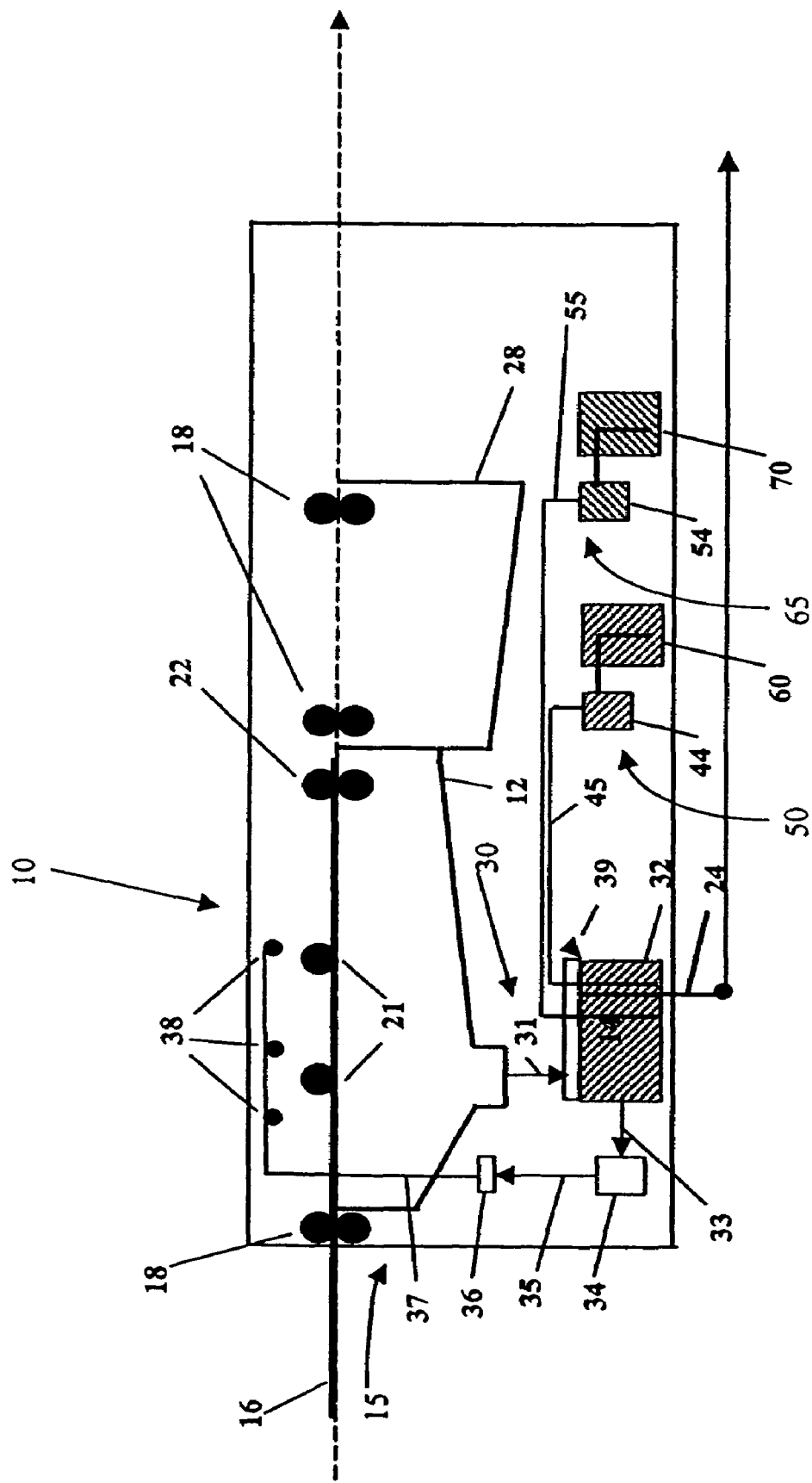
FIG. 1 is a schematic illustration of an exemplary developer system of an embodiment of the present invention.

In one embodiment, the present invention provides an aqueous regenerator for addition to an aqueous developer that includes an organic solvent, a dispersing agent and a weak base, and that has a pH between about 8 and less than about 13. The aqueous regenerator includes an organic solvent and a dispersing agent, as well as an effective amount of a strong base such that the regenerator has a pH greater than the pH of the developer.

A wide range of suitable organic solvents may be included in the aqueous regenerator of the present invention. Suitable organic solvents generally include organic solvents, including the reaction products of phenol and ethylene oxide or propylene oxide, the reaction products of esters of ethylene glycol and propylene glycol with acids containing alkyl groups of $C_{1-6}$, and the reaction products of ethers of ethylene glycol, diethylene glycol and propylene glycol containing alkyl groups of $C_{1-6}$ (e.g. 2-butoxyethanol, or 2-ethoxyethanol). Examples of suitable organic solvents include phenoxyethanols, phenoxypropanols, phenylpropanols, phenylbutanols, benzyloxyethanols, alkoxybenzyl alcohols, benzyl alcohol, and cyclohexanols. The organic solvent concentration may range between about 1 and about 12 weight percent, more particularly, between about 3 and about 6 weight percent. Combinations of these solvents may also be used.

Suitable dispersing agents include anionic, cationic, nonionic and amphoteric surfactants. Examples of suitable surfactants include sulfates and sulfonates, for example, alkali metal alkyl sulfates, alkali metal alkylnaphthalenesulfonates and alkali metal alkylbenzene sulfonates Other surfactants may include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, cane sugar fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenized castor oils, polyoxyethylene glycerin fatty acid partial esters, fatty acid diethanolamides, N,N-bis-2-hydroxyalkylamines, polyoxyethylene alkylamines, triethanolamine fatty acid esters, and trialkylamine oxides, fatty acid salts, abietic acid salts, dialkylsulfosuccinic acid esters, N-methyl-N-oleyltaurin sodium salt, alkylphosphonic acid esters, polyoxyethylene alkyl ether phosphoric acid esters, polyoxyethylene alkyl phenyl ether phosphoric acid esters, partially saponified styrene/maleic anhydride copolymers, partially saponified olefin/maleic anhydride copolymers, alkylamine salts, quaternary ammonium salts, polyoxyethylene alkylamine salts, and polyethylene polyamine derivatives, carboxybetaines, aminocarboxylic acids, sulfobetaines, aminosulfuric acid esters, and imidazolines. Particularly suitable surfactants include sodium octyl sulfate, sodium methylnaphthalenesulfonate, sodium xylene sulfonate and sodium toluene sulfonate. The concentration of each dispersing agent may range from between about 0.1 and about 10 weight percent, more particularly, between about 1 and about 7 weight percent. Total dispersing agent concentration may range from between about 4 and about 20 weight percent, more particularly, between about 7 and 15 weight percent. The dispersing agent may be added to the regenerator as an aqueous solution.

Suitable strong bases for embodiments of the present invention may have a $K_b$ value of about one or greater. Examples of suitable strong bases include hydroxides, more particularly metal hydroxides such as sodium, potassium or lithium hydroxide. Combinations of strong bases may be used so long as the pH of the resulting regenerator is greater than the pH of the developer. The concentration of the strong base may range between about 0.1 and about 5.0 weight percent. The strong base may be added to the developer as an aqueous solution.

Optional weak bases for embodiments of the present invention may have a $K_b$ value of between about $1 \times 10^{-2}$ and about $1 \times 10^{-5}$. Examples of suitable weak bases include organic amines such as monoethanolamine, diethanolamine, or triethanolamine. Other suitable weak bases include sodium carbonate, potassium carbonate, sodium bicarbonate, potassium bicarbonate, trisodium phosphate and tripotassium phosphate. The regenerator may have a weak base concentration between about 0.1 and about 5.0 weight percent. Suitable weak bases may be added to the regenerator as aqueous solutions. Embodiments of the present invention may also optionally include additives such as thickeners, preservatives, conditioners, chelating agents and antifoaming agents.

The regenerator of the present invention may be used in aqueous developer systems to maintain the activity of a developer while developing imaged printing plate precursors. As previously noted, developers lose activity as an increasing number of printing plate precursors are developed. However, the regenerator of the present invention is adapted to maintain sufficient developer activity such that consistent dot sizes are observed throughout a development cycle. The pH of the regenerator of the present invention may be at least about 0.5 higher, more particularly at least about 0.7 higher, even more particularly at least about 1.0 higher than the pH of the developer to which it is to be added.

In operation, the aqueous developer and regenerator may be used with conventional developer systems. Conventional developer systems may include a developer unit that is adapted to store developer, and to apply developer to printing plate precursors received by the developer system. The developer may be applied to the printing plate precursors, for example, by contacting the developer to the printing plate precursors in a developer bath, or by pumping the developer out of sprayers directed towards the printing plate precursors. Scrubbers may also be used as part of the development process. Additionally, the developer unit may include a circulation unit to filter and reuse the developer.

Such developer systems may also include an additional unit that is adapted to house the regenerator and to controllably deliver the regenerator to the developer unit. The additional unit may include an suitable controllable conduit to facilitate controlled delivery of the regenerator.

An alternate developer system 10 is illustrated in FIG. 1. The developer system includes a developer unit 15 which applies developer 14 to printing plate precursors 16. The developer unit 15 includes a developing area 12 which receives the precursors 16, brushes 21 to scrub the precursors 16, and sprayers 38 to apply or contact the aqueous developer 14 to the surface of the precursors 16. One or more guide rollers 18 drive and/or guide the precursors 16 through the developer area 12. At the exit of the developer unit 15, a water rinse tank 28 is adapted to remove excess developer from the developed printing plate. One or more rollers 22 serve to remove remaining developer 14 from the plate surface 16 before the plate 16 enters the water rinse tank 28. The water rinse tank may include one or more sprayers and/or scrubbers, and may optionally re-circulate spent water through a filter for multiple uses. The developer system may also include a unit at the exit of the rinse tank 28 (not shown) that applies a gum or other desensitizer to protect the surface of printing plate.

The developer unit 15 further includes a circulation unit 30, which includes a developer vessel 32, a pump 34 and a filtration system 36. Conduit 31 connects the developing area 12 to the developer vessel 32. The developer vessel 32 is connected to pump 34 via conduit 33. When pump 34 is activated, developer is delivered from the developer vessel 32, through conduit 35 and filter 36. The developer then flows through conduit 37 to spray bars 38 in the developing area 12, where developer 14 is applied to the printing plate precursor 16. In this manner, developer 14 may be applied to printing plate precursors 16, filtered and then reused to develop additional printing plate precursors 16.

The developer system 10 also includes a replenisher unit 50, including a replenisher vessel 60, which is connected to developer vessel 32 via conduit 45 that includes pump 44. The replenisher unit 50 is adapted to optionally deliver replenisher to the developer unit 15 if desired. The developer system 10 further includes a regenerator unit 65. The regenerator unit 65 includes a regenerator vessel 70 which is connected to developer vessel 32 via conduit 55 that includes pump 54. The regenerator unit 65 is adapted to controllably delivery regenerator to the developer vessel 32. A standpipe 24 is positioned relative to developer vessel 32 so that excess solution in the developer vessel 32 may be disposed of. In this manner, the developer system is adapted to add regenerator and optional replenisher to maintain the activity of the developer. The developer vessel 32 may further include a mixing device to expedite mixing of the regenerator and optional replenisher into the developer. The developer system 10 illustrated in FIG. 1 is further reported in the U.S. patent application Ser. No. 10/681,575 entitled "Developer System,", which has the same filing date as the present application, and is incorporated herein by reference.

There are a variety of ways to provide controlled delivery of the regenerator and optional replenisher to the developer unit 15. In one embodiment, the development unit includes one or more sensors 39 for monitoring the volume or level of the developer in the developer vessel. If the developer volume or level is too low, the sensors 39 communicate with the regenerator unit 65 and optionally the replenisher unit 50 to supplement the developer with regenerator and optional replenisher. Alternatively, sensors 39 may monitor the precursor area that is developed, and then communicate with the regenerator unit 65 and optionally the replenisher unit 50 to add regenerator and optional replenisher to the developer vessel 32 after a predetermined precursor area or number of precursors have been developed. In another embodiment, regenerator and optional replenisher may be added as a function of the speed at which the developer system 10 is developing the precursors 16. For example pumps 44 and/or 54 may be set to deliver a volume of regenerator and optional replenisher at predetermined time intervals. In yet a further embodiment, one or more sensors 39 may monitor the activity of the developer 14. For example, sensors 39 may monitor the pH or conductivity of the developer. If the activity varies beyond a certain amount, the sensor 39 communicates with the regenerator unit 65 and optionally the replenisher unit 50 to add additional regenerator and optional replenisher. For example, the sensors 39 may be configured to electronically communicate with pumps 44 and/or 54 to deliver the regenerator and optional replenisher. Suitable sensor systems are available from Oakton Instruments, Vernen Hills, Ill., and include the D.A.M. and Q.D.M. brand systems. An example of a particular pH sensor is the OAKTON pH/ORP Controller 800 series, available from Oakton Instruments. Although these sensors are described in reference to the processor illustrated in FIG. 1, such sensors may be used in conventional processors having a single vessel for adding regenerator.

Combinations of these sensors may also be used to maintain developer activity. For example, the replenisher may be added to the developer vessel 32 after a certain number of plates or total plate area has been developed. However, the regenerator may be added to the developer vessel 32 by utilizing a pH sensor that communicates with pump 54 to deliver regenerator when the pH varies beyond a certain level. As is evident from the foregoing, the system 10 does not necessarily deliver regenerator and optional replenisher in the same amounts or at the same time. Likewise, the system 10 may provide for controlled delivery of the replenisher and the regenerator in different ways.

Although sensors 39 are described in reference to the developer system of FIG. 1, similar sensors may be incorporated into conventional developer systems that include only a regenerator unit and not a replenisher unit. For example, a developer system may include a sensor adapted to monitor the number of printing plate precursors being developed, and to communicate with the regenerator unit to controllably deliver a fixed volume of regenerator per square foot of developed plate.

In one embodiment, a sufficient amount of regenerator and optional replenisher is added to a volume of developer to maintain the pH of the developer at between about 8 and less than about 13, more particularly between about 9 and about 11, and even more particularly between about 9.5 and about 10.5. In another embodiment, sufficient regenerator and optional replenisher is added to a volume of developer to maintain the organic solvent concentration of the developer at between about 2 and about 8 weight percent, more particularly between about 3 and about 6 weight percent. In yet another embodiment, sufficient regenerator and optional replenisher is added to a volume of developer to maintain the total concentration of the dispersing agent at between about 4 and about 20 weight percent, more particularly between about 7 and about 15 weight percent. In yet a further embodiment, sufficient regenerator and optional replenisher is added to the developer to maintain the conductivity of the developer at between about 10 and about 40 millisiemens, more particularly, between about 10 and about 20 millisiemens. The specific amount of regenerator and optional replenisher sufficient to maintain developer activity will vary based on a number of factors apparent to those of skill in the art. Such factors include the volume and specific type of developer, the composition of the printing plate precursors, the composition of the regenerator, the frequency of regenerator addition, the activity level being measured, and the surface area of printing plate precursors being developed. Furthermore, at times, the delivery of the regenerator and the optional replenisher may increase the activity of the developer above the original activity of the developer without adversely affecting developer performance. For example, the delivery of regenerator and optional replenisher may increase the pH or the conductivity of the developer above the original pH or conductivity of the developer for a period of time.

The developer and regenerator reported herein are suitable for use in developing a variety of 1-side and 2-sided printing plate precursors incorporating many types of radiation-sensitive compositions applied onto a substrate. Suitable radiation-sensitive compositions may be laser imageable, and may include a polymeric material and a radiation-sensitive component. Optional additives include dispersing agents, humectants, biocides, surfactants, viscosity builders, colorants (e.g. acid black), pH adjusters, drying agents, and defoamers, as well as combinations of these additives.

Suitable polymeric materials for use in the radiation-sensitive composition may include acidic or weakly basic functionality (or other functionality affecting the activity of the developer), for example, carboxylic acid moieties. Examples of such polymeric materials include acrylic acid polymers, methacrylic acid polymers, and copolymers, derivatives and combinations thereof. Such acidic moieties tend to adversely affect the pH of the developer, which, at least in part, necessitates the addition of regenerator of the present invention. Other suitable polymeric materials may include phenolic resins, for example novolak resins.

The radiation-sensitive component may be sensitive to ultraviolet, visible, infrared and/or thermal radiation such that the portions of the radiation-sensitive composition that are exposed to the radiation become either more or less developable in a particular developer than unexposed portions of the composition. Suitable radiation-sensitive components are well known to those of skill in the art, and generally include dyes and pigments. In a particular embodiment, the radiation-sensitive composition is laser imageable.

Suitable substrates for the present invention may vary widely depending upon the desired application and the specific composition employed. Suitable substrates or substrate surfaces may be hydrophilic, and may be composed of metals, polymers, ceramics, stiff papers, or laminates or composites of these materials. Suitable metal substrates include aluminum, zinc, titanium and alloys thereof. In one embodiment, the substrate includes aluminum, which may be grained, anodized and/or post-treated with a suitable interlayer material. Suitable polymeric supports may include polyethylene terephthalate and polyester films. The substrate may be of sufficient thickness to sustain the wear from printing or other desired applications, and may be thin enough to wrap around a printing form, typically having a thickness from about 100 to about 700 μm.

The resulting printing plate precursor may then be imagewise exposed to radiation such that exposed portions of the radiation-sensitive composition become either more or less soluble in a developer than unexposed portions. Suitable types of radiation include UV, IR, visible and thermal radiation. IR radiation may be particularly useful for embodiments of the present invention. More particularly, suitable printing plate precursors may be imaged with a laser or an array of lasers emitting ultraviolet, visible, near infrared or infrared radiation in a wavelength region that is absorbed by the element. Infrared radiation exposure, especially infrared radiation in the range of about 800 nm to about 1200 nm, may be carried out with a laser emitting at about 830 nm or at about 1064 nm. Suitable commercially available imaging devices include image setters such as a Creo Trendsetter (available from the CREO Corp., British Columbia, Canada), a Gerber Crescent 42T (available from the Gerber Corporation), and Screen Platerite Models 4300, 8600 and 8800 (Screen, Rolling Meadows, Chicago). Suitable stochastic screening systems include Staccato brand stochastic screening available from Creo Corp, and Spekta brand stochastic screening available from Screen.

Exemplary printing plates precursors, which may be developed with methods and systems incorporating the regenerator of the present invention, are reported in U.S. Pat. No. 6,528,228 to Hauck et al., U.S. Pat. No. 6,555,291 to Hauck, U.S. Pat. No. 6,294,311 to Shimazu et al., U.S. Pat. No. 6,352,811 to Patel et al. and U.S. Published Application No. 2003/0129526 to Haley et al., all of which are incorporated herein by reference. SWORD EXCEL brand plates, available from Kodak Polychrome Graphics are particularly suitable for use with embodiments of the present invention. Other suitable radiation-sensitive compositions and printing plate precursors are reported in U.S. Pat. No. 6,309,792 and U.S. patent application Ser. No. 10/353,106, both of which are incorporated herein by reference.

Adding the regenerator of the present invention to a suitable developer may be particularly useful when developing printing plates that are imaged using stochastic screening techniques. The addition of the regenerator helps to maintain consistent dot densities over a development cycle, in particular, development cycles of substantial length. The addition of regenerator may also be more cost efficient than adding replenisher alone.

EXAMPLE 1

A SWORD EXCEL printing plate precursor was image-wise exposed with 830 nm radiation, using an internal test pattern on a Creo 3230 Trendsetter (exposure energy=120 mjcm$^{-2}$), available from Creo Products Inc., Burnaby, BC, Canada. The internal test pattern contained 1, 2, 3, 5, 10, 15, 20, 30, 40, 45, 50, 55, 60, 70, 80, 85, 90, 95, 98, 99, 99.5 and 100 percent dot images. The image-wise exposure was carried out using both Creo Staccato (FM) 10 micron and 20 micron screening.

The resulting imaged precursor was developed using an 850 Sword II plate processor, an 850 mm processor as supplied by Glunz and Jensen, Elkwood, Va., in the following configuration:

Developer=956 Developer
Developer filter=20 inch, 15 micron wound from Stonehand (Denver, Colo.)
Two plush rollers used in developer tank
Processing speed=3.5 ft/min
Initial charge of developer=10 gallons
Replenisher=956 Developer
Developer replenishment rate=2 ml/ft$^2$ of plate
Regenerator=None The processor had been recently cleaned and new developer and filters installed. Plate resolution was then measured using a X-Rite 528 densitometer (CannonDirect, Bethel, Ohio).

After developing the imaged precursor, 100 square foot increments of exposed (as above, but with a solid, 100% exposure pattern, in AM mode) SWORD EXCEL plate precursor ("bulk precursor") was developed through the processor to replicate pre-press environment.

After about 1500 ft$^2$ of bulk precursor had been developed, another SWORD EXCEL printing plate precursor was imaged, developed and measured for resolution as above.

After about 2200 ft$^2$, of bulk precursor had been developed, another SWORD EXCEL precursor was imaged, developed and measured for resolution as above. Resolution for the each printing plate is shown in Table 1.

TABLE 1

|  | 10 Micron Staccato Screen | | | 20 Micron Staccato Screen | | |
|---|---|---|---|---|---|---|
| Area of Sword Excel Processed | 0 ft$^2$ | 1500 ft$^2$ | 2200 ft$^2$ | 0 ft$^2$ | 1500 ft$^2$ | 2200 ft$^2$ |
| Theoretical dot/% | | | | | | |
| 50 | 47 | 48 | 52 | 46 | 48 | 50 |
| 60 | 56 | 57 | 62 | 56 | 57 | 59 |

As demonstrated in Table 1, using 10 micron Staccato screening, dot percentages varied by 5 and 6 percent, respectively. With 20 micron Staccato screening, dot percentages varied by 4 and 3 percent, respectively.

EXAMPLE 2

Precursors A, B and C, each SWORD EXCEL printing plate precursors, were image-wise exposed with 830 nm radiation, using an internal test pattern on a Creo 3230 Trendsetter (exposure energy=120 mjcm$^{-2}$), available from Creo Products Inc., Burnaby, BC, Canada. The internal test pattern for each precursor included 50 percent dot images. The image-wise exposure for portions of each plate precursor was carried out using Creo Staccato (FM) 10 micron screening, Creo Staccato (FM) 20 micron screening and conventional (AM) 200 lines/inch screening.

A 7500 square foot (in 100 square foot increments) cycle of bulk precursor imaged using a 100 percent exposure pattern was developed with an 85 NS plate processor, available from Technical Services International, Kennett Square, Pa., which was modified to include a regenerator unit as shown in FIG. 1, and an OAKTON pH/ORP Controller 800 Series pH sensor (in-line, continuous) from Oakton Instruments, Vernon Hills, Ill. The processor was further modified to include a standpipe in the developer vessel (FIG. 1) to maintain a substantially constant volume. The modified processor was then configured as follows:

Developer=956 Developer
Developer filter=15 micron wound filter (Stonehand, Denver, Colo.)
Processing speed=3.5 ft/min
Initial charge of developer=10 gallons
Replenisher=956 Developer
Regenerator=Regenerator 1

956 Developer is an aqueous developer available from Kodak Polychrome Graphics, which includes a weak base, organic solvent and dispersing agent, and has a pH of about 10. Table 2 below lists the components of Regenerator 1.

TABLE 2

|  | Regenerator 1 |
|---|---|
| Water | 601.88 g |
| Silicone Antifoam Agent - DC Antifoam B - 15% | 0.10 g |
| Sodium Octyl Sulfate - 42% | 120.50 g |
| Sodium Methylnaphthalenesulfonate - 50% | 88.90 g |
| Triton H-66 - 42% | 24.00 g |
| Diethanolamine - 85% | 12.00 g |
| Trisodium Phosphate - 43.12% | 9.20 g |
| Sodium Hydroxide - 50% | 50.00 g |
| p-Toluenesulfonic Acid | 0.92 g |
| 2-Phenoxyethanol | 44.20 g |
| EDTA Tetra Sodium Salt | 7.70 g |
| Glycerin - 99.7% | 40.60 g |
| Total | 1000.00 g |
| pH | 13.30 |
| Conductivity (mS) | 91.30 |

DC Antifoam B is available from Dow. Silicone Anti Foam Agent SE 57 is available from BYK Chemie, Wallingford, Conn. Triton H-66 is a phosphate ester available from Dow.

Precursors A, B and C were developed after 1000, 4000 and 7000 ft$^2$, respectively, of bulk precursor had been developed. During the cycle, replenisher was added to the developer unit at a rate of about 2 ml per square foot of image precursor that was developed. Regenerator 1 was added to the developer as a function of the pH of the developer in the system. More particularly, the pH sensor was configured to electronically communicate with the regenerator pump when the pH of the developer dropped below 9.89. Table 3 shows the amount of regenerator used during the cycle, which averaged about 2 ml of regenerator per square foot of imaged precursor. The amount of regenerator used was measured by monitoring volume loss in the regenerator vessel.

TABLE 3

| Square Footage | Regenerator(ml) |
|---|---|
| 400 | 0 |
| 800 | 0 |
| 1200 | 2704 |
| 1600 | 0 |
| 2000 | 0 |
| 2400 | 0 |
| 2800 | 1217 |
| 3200 | 97 |
| 3600 | 1767 |
| 4000 | 270 |
| 4400 | 1866 |
| 4800 | 0 |
| 5200 | 168 |
| 5400 | 826 |
| 5600 | 1723 |
| 5800 | 137 |
| 6200 | 1370 |
| 6600 | 170 |
| 7000 | 461 |
| 7400 | 740 |
| 7500 | 1325 |
| Total | 14841 |
| ml/ft$^2$ | 1.98 |

Dot densities for Precursors A, B and C were measured with a Greytag D196 densitometer after development. The results are summarized in Table 4.

TABLE 4

| Precursor (Sq Ft) | Staccato 10 (Stochastic 10 micron) | Staccato 20 (Stochastic 20 micron) | Standard AM Screening |
|---|---|---|---|
| A (1000) | 41% | 42% | 45% |
| B (4000) | 42% | 42% | 46% |
| C (7000) | 43% | 44% | 46% |

The dot densities varied between one and two percent for the three screening methods, despite operating for three times the cycle length of Example 1. The dot density variation shown in Table 4 constitutes a significant improvement over the variation in Example 1, and is an acceptable level of variation in pre-press environment for many commercial applications.

EXAMPLE 3

Precursors A-O, each SWORD EXCEL printing plate precursors, were image-wise exposed as in Example 1, with an internal pattern using conventional (AM) screening at 200 lines/inch, Staccato (FM) 10 screening and Staccato (FM) 20 screening. The conventional screening pattern included dot densities of 1, 2, 5, 20, 40, 50, 60, 98 and 99 percent, as well as 1×1, 2×2, 3×3 and full density. The Staccato 10 and 20 screening patterns included 1, 2, 5, 20, 40, 50, 60, 98 and 99 percent dot densities.

A 7500 square foot (in 100 square foot increments) cycle of bulk precursor was imaged and developed as in Example 1, except that no replenisher was added to the developer. Instead, 5 ml of Regenerator 2 per square foot of developed precursor was added to the developer as a function of the number of precursors developed. The components of Regenerator 2 are listed in Table 5.

TABLE 5

| | Regenerator 2 |
|---|---|
| Water | 738.00 g |
| Silicone Antifoam Agent - DC Antifoam B - 15% | 0.80 g |
| Sodium Octyl Sulfate - 42% | 67.00 g |
| Sodium Methylnaphthalenesulfonate - 50% | 59.00 g |
| Triton H-66 - 42% | 3.50 g |
| Diethanolamine - 85% | 14.00 g |
| Sodium Hydroxide - 50% | 7.50 g |
| p-Toluenesulfonic Acid | 1.20 g |
| 2-Phenoxyethanol | 45.50 g |
| Hydropalat 3204 - 50% | 7.50 g |
| EDTA Tetra Sodium Salt | 9.00 g |
| Glycerin - 99.7% | 47.00 g |
| Total | 1000.00 g |
| pH | 12.5 |

Dot densities were measured by developing one of Precursors A-O for every 500 square feet of bulk precursor developed. Dot densities were measured by the densitometer used in Example 2. The results are summarized in Tables 6-8 for each screening method.

TABLE 6

Conventional Screening

| Precursor (ft$^2$) | 1% | 2% | 5% | 20% | 40% | 50% | 60% | 98% | 99% | 1×1 | 2×2 | 3×3 | Solid Density |
|---|---|---|---|---|---|---|---|---|---|---|---|---|---|
| A (0) | 1 | 2 | 5 | 20 | 40 | 50 | 60 | 99 | 99 | 58 | 53 | 51 | 96 |
| B (500) | 1 | 2 | 5 | 20 | 40 | 50 | 60 | 98 | 99 | 59 | 53 | 52 | 97 |
| C (1000) | 1 | 2 | 5 | 19 | 40 | 50 | 60 | 99 | 99 | 59 | 53 | 52 | 97 |
| D (1500) | 0 | 1 | 4 | 19 | 39 | 49 | 60 | 97 | 98 | 59 | 53 | 51 | 97 |
| E (2000) | 1 | 2 | 5 | 19 | 39 | 50 | 60 | 97 | 98 | 60 | 53 | 52 | 96 |
| F (2500) | 0 | 2 | 5 | 19 | 40 | 50 | 61 | 98 | 99 | 60 | 52 | 51 | 97 |
| G (3000) | 0 | 2 | 5 | 20 | 39 | 49 | 60 | 97 | 98 | 61 | 53 | 51 | 97 |
| H (3500) | 0 | 1 | 4 | 19 | 40 | 50 | 61 | 97 | 98 | 61 | 52 | 52 | 96 |
| I (4000) | 0 | 1 | 4 | 19 | 39 | 49 | 60 | 98 | 98 | 58 | 53 | 52 | 96 |
| J (4500) | 0 | 1 | 4 | 19 | 39 | 50 | 60 | 97 | 98 | 59 | 53 | 52 | 95 |
| K (5000) | 0 | 1 | 3 | 18 | 39 | 49 | 59 | 98 | 98 | 59 | 53 | 51 | 97 |
| L (5500) | 0 | 1 | 4 | 19 | 40 | 50 | 60 | 97 | 98 | 60 | 53 | 51 | 97 |
| M (6000) | 0 | 1 | 3 | 18 | 40 | 50 | 59 | 98 | 99 | 59 | 53 | 52 | 97 |
| N (6500) | 0 | 1 | 4 | 20 | 39 | 49 | 60 | 97 | 98 | 61 | 53 | 52 | 96 |
| O (7000) | 1 | 1 | 5 | 19 | 40 | 50 | 60 | 97 | 98 | 61 | 53 | 52 | 97 |

TABLE 7

Staccato 10 Screening

| Precursor (ft$^2$) | 1% | 2% | 5% | 20% | 40% | 50% | 60% | 98% | 99% |
|---|---|---|---|---|---|---|---|---|---|
| A (0) | 0 | 1 | 5 | 20 | 38 | 49 | 60 | 98 | 99 |
| B (500) | 1 | 1 | 4 | 19 | 39 | 50 | 60 | 98 | 99 |
| C (1000) | 1 | 2 | 5 | 20 | 39 | 49 | 59 | 98 | 99 |
| D (1500) | 1 | 1 | 5 | 20 | 40 | 50 | 59 | 98 | 98 |
| E (2000) | 1 | 1 | 4 | 19 | 40 | 50 | 60 | 97 | 99 |
| F (2500) | 1 | 2 | 4 | 20 | 41 | 51 | 60 | 98 | 99 |
| G (3000) | 0 | 2 | 4 | 19 | 40 | 51 | 60 | 97 | 98 |
| H (3500) | 0 | 1 | 5 | 21 | 42 | 50 | 60 | 97 | 98 |
| I (4000) | 0 | 1 | 4 | 20 | 40 | 51 | 60 | 98 | 98 |
| J (4500) | 0 | 1 | 4 | 19 | 40 | 51 | 61 | 97 | 98 |
| K (5000) | 0 | 2 | 3 | 20 | 40 | 50 | 60 | 98 | 99 |
| L (5500) | 0 | 1 | 4 | 20 | 40 | 51 | 60 | 97 | 98 |
| M (6000) | 0 | 1 | 3 | 19 | 41 | 51 | 61 | 98 | 99 |
| N (6500) | 0 | 1 | 4 | 19 | 41 | 50 | 61 | 97 | 98 |
| O (7000) | 0 | 1 | 4 | 20 | 40 | 51 | 60 | 98 | 99 |

TABLE 8

Staccato 20 Screening

| Precursor (ft$^2$) | 1% | 2% | 5% | 20% | 40% | 50% | 60% | 98% | 99% |
|---|---|---|---|---|---|---|---|---|---|
| A (0) | 0 | 1 | 5 | 18 | 39 | 50 | 60 | 98 | 99 |
| B (500) | 0 | 2 | 5 | 19 | 39 | 50 | 60 | 98 | 99 |
| C (1000) | 1 | 2 | 5 | 20 | 40 | 50 | 60 | 98 | 99 |
| D (1500) | 0 | 2 | 5 | 20 | 40 | 50 | 61 | 97 | 98 |
| E (2000) | 0 | 2 | 5 | 19 | 40 | 49 | 61 | 97 | 98 |
| F (2500) | 0 | 2 | 4 | 19 | 40 | 51 | 60 | 99 | 100 |
| G (3000) | 0 | 1 | 4 | 19 | 40 | 50 | 60 | 97 | 98 |
| H (3500) | 1 | 1 | 4 | 20 | 40 | 51 | 61 | 97 | 98 |
| I (4000) | 0 | 1 | 4 | 19 | 39 | 50 | 61 | 97 | 98 |
| J (4500) | 0 | 1 | 4 | 18 | 39 | 50 | 59 | 97 | 98 |
| K (5000) | 0 | 1 | 4 | 19 | 40 | 51 | 60 | 98 | 98 |
| L (5500) | 1 | 1 | 4 | 19 | 40 | 50 | 60 | 97 | 98 |
| M (6000) | 1 | 1 | 4 | 19 | 40 | 50 | 60 | 98 | 99 |
| N (6500) | 0 | 1 | 5 | 20 | 40 | 51 | 61 | 97 | 98 |
| O (7000) | 0 | 1 | 4 | 20 | 41 | 50 | 61 | 97 | 98 |

The data shown in Tables 6-8 demonstrate that the use of regenerators results in less overall variation in dot density even over significantly longer cycle lengths than in Example 1.

The invention claimed is:

1. A method for treating an aqueous developer after developing at least a portion of one printing plate precursor, the aqueous developer comprising an organic solvent, a dispersing agent and a weak base, and having a pH between about 8 and less than about 13, the method comprising:
   adding to the aqueous developer an effective amount of an aqueous regenerator to maintain the activity of the aqueous developer, the aqueous regenerator comprising an organic solvent, a dispersing agent, and an effective amount of at least one strong base such that the regenerator has a greater pH than the developer, wherein the $K_b$ of the strong base is greater than the $K_b$ of the weak base,
   wherein the aqueous regenerator has a pH at least 0.7 higher than the pH of the aqueous developer, and
   said printing plate precursor comprises a radiation-sensitive composition applied to a substrate, said radiation-sensitive composition comprising a plurality of layers including a first layer that is soluble in aqueous developer, and a second layer applied to said first layer, the second layer comprising a polymeric material that is not soluble in the aqueous developer.

2. The method of claim 1 comprising adding an effective amount of the aqueous regenerator to maintain the pH or conductivity of the aqueous developer.

3. The method of claim 1 wherein the adding step comprises maintaining the pH of the aqueous developer at between about 8 and about 12.

4. The method of claim 1 wherein the adding step comprises maintaining the pH of the aqueous developer at between about 9.5 and about 10.5.

5. The method of claim 1 comprising adding an effective amount of the aqueous regenerator to maintain the organic solvent concentration of the aqueous developer.

6. The method of claim 1 wherein the adding step comprises maintaining the organic solvent concentration of the aqueous developer at between about 2 and about 8 weight percent.

7. The method of claim 1 comprising adding an effective amount of the aqueous regenerator to maintain the dispersing agent concentration of the aqueous developer at between about 7 and about 15 weight percent dispersing agent.

8. The method of claim 1 comprising adding an effective amount of a replenisher and the aqueous regenerator to maintain the activity of the aqueous developer.

9. The method of claim 1 wherein the weak base has a $K_b$ of between about $1\times10^{-2}$ to about $1\times10^{-5}$ and the strong base has a $K_b$ of about 1 or greater.

10. The method of claim 1 wherein the aqueous regenerator has a pH at least 1.0 higher than the pH of the aqueous developer.

11. The method of claim 1 wherein the organic solvent in the aqueous regenerator comprises an alcohol.

12. The method of claim 1 wherein the weak base comprises an amine, sodium carbonate, potassium carbonate, sodium bicarbonate, trisodium phosphate, tripotassium phosphate, or a combination thereof and the strong base comprises a hydroxide.

13. The method of claim 1 further comprising:
   after the aqueous regenerator is added to the aqueous developer, contacting a portion of at least one additional imaged printing plate precursor with the aqueous developer.

14. The method of claim 1 wherein the radiation-sensitive composition is laser imageable.

15. The method of claim 14 wherein the radiation-sensitive composition comprises an infrared absorbing compound.

16. The method of claim 1 wherein the radiation-sensitive composition comprises a polymeric material that comprises an acidic or weakly basic functionality.

17. The method of claim 1 comprising:
   repeating the developing of a least a portion of a printing plate precursor with the aqueous developer and adding the aqueous regenerator to the aqueous developer, a plurality of times.

18. The method of claim 1 wherein prior to the developing step,
   imagewise exposing a plurality of printing plate precursors to radiation using stochastic screening to form a plurality of imaged printing plate precursors, wherein the stochastic screening comprises first or second order stochastic screening, or combined screening that includes both stochastic screening and conventional screening.

* * * * *